(12) United States Patent
Bhattacharya

(10) Patent No.: US 6,332,967 B1
(45) Date of Patent: Dec. 25, 2001

(54) ELECTRO-DEPOSITION OF SUPERCONDUCTOR OXIDE FILMS

(75) Inventor: Raghu N. Bhattacharya, Littleton, CO (US)

(73) Assignee: Midwest Research Institute, Kansas City, MO (US)

( * ) Notice: Subject to any disclaimer, the term of this patent is extended or adjusted under 35 U.S.C. 154(b) by 0 days.

(21) Appl. No.: 09/448,612

(22) Filed: Nov. 23, 1999

(51) Int. Cl.$^7$ ............................... C25D 7/00; C25D 5/10; C23C 28/02
(52) U.S. Cl. ..................... 205/51; 205/170; 205/186; 205/227; 505/472; 505/500; 505/501; 505/510
(58) Field of Search ................... 205/170, 186, 205/227, 51; 505/472, 500, 501, 510, 470; 427/372.2; 148/96

(56) References Cited

U.S. PATENT DOCUMENTS

| | | | |
|---|---|---|---|
| 3,798,139 | 3/1974 | Schwartz | 204/56 R |
| 4,180,445 | 12/1979 | Bennett et al. | 204/129 |
| 4,392,920 | 7/1983 | McDonald | 204/37 R |
| 4,394,224 | 7/1983 | Mahoon et al. | 204/57 |
| 4,865,701 | 9/1989 | Beck et al. | 204/67 |
| 4,911,800 | 3/1990 | Sadoway et al. | 204/56.1 |
| 4,971,663 | 11/1990 | Sadoway et al. | 204/56.1 |
| 5,069,763 | 12/1991 | Hardcovsky | 205/326 |
| 5,118,663 | * 6/1992 | Woolf et al. | 505/1 |
| 5,254,238 | 10/1993 | Ishii et al. | 205/155 |
| 5,376,594 | * 12/1994 | Covino-Hrbacek | 501/12 |
| 5,789,348 | * 8/1998 | Bhattacharya | 505/492 |

OTHER PUBLICATIONS

Bhattacharya, R.N.; Parilla, P.A.; Blaugher, R.D.; Ren, Z.F.; Li, W.: Wang, J.H.; Wang, Y.T.; Hermann, A.M.; Paranthaman, M.; Goyal, A.; Verebelyi, D.T.; and Christen D.K. ("Superconducting $(TlBi)_{0.9}Sr_{1.6}Ba_{0.4}Ca_2Cu_3Ag_{0.2}O_x$ Films From Electrodeposited Precursors" *IEEE Transactions on Applied Superconductivity*, vol. 9, No. 2, Jun. 1999, pp 1681–1683.

Bhattacharya, R.N.; Blaugher, R.D.; Natarajan, A.; Carlson, C.M.; Parilla, P.A.; Ginley, D.S.; Paranthaman, M.; Goyal, A.; Kroeger, D.M. "Thin–Film Processing for TL–Oxide Wire and Tape" *Journal of Superconductivity*, vol. 11, No. 1, 1998, pp 173–180.

Negishi et al., "Preparation and Characterization of Tl–2223 Superconductor Coating Using the Electrophoretic Deposition method", J. Ceram. Soc. Jpn., vol. 105 (Mar.), pp. 241–245, 1997 no month available.*

Bhattacharya et al., "Thick–Film Processing for TL–Oxide Wire and Tape", J. of Supercond., vol. 11, No. 1, pp. 173–180, 1998 no month available.*

Bhattacharya et al., "Superconducting Thallium Oxide Films by the Electrodeposition Method", Physica C (Amsterdam), vol. 304, Nos. 1 & 2, pp. 55–65, 1998 no month available.*

* cited by examiner

Primary Examiner—Edna Wong
(74) Attorney, Agent, or Firm—Paul J. White

(57) ABSTRACT

Methods for preparing high quality superconducting oxide precursors which are well suited for further oxidation and annealing to form superconducting oxide films. The method comprises forming a multilayered superconducting precursor on a substrate by providing an electrodeposition bath comprising an electrolyte medium and a substrate electrode, and providing to the bath a plurality of precursor metal salts which are capable of exhibiting superconducting properties upon subsequent treatment. The superconducting precursor is then formed by electrodepositing a first electrodeposited (ED) layer onto the substrate electrode, followed by depositing a layer of silver onto the first electrodeposited (ED) layer, and then electrodepositing a second electrodeposited (ED) layer onto the Ag layer. The multilayered superconducting precursor is suitable for oxidation at a sufficient annealing temperature in air or an oxygen-containing atmosphere to form a crystalline superconducting oxide film.

30 Claims, 9 Drawing Sheets

ELECTRO-DEPOSITION OF SUPERCONDUCTOR OXIDE FILMS

GOVERNMENT INTERESTS

The United States Government has certain rights in this invention under Contract No. DE-AC36-99GO-10337 between the United States Department of Energy and the National Renewable Energy Laboratory, a division of the Midwest Research Institute.

BACKGROUND OF THE INVENTION

1. Field of the Invention

The present invention relates generally to superconducting oxide films and processes for forming thick films of superconducting oxide films. More particularly, the present invention is directed to a electrodeposition process where oxygen is bubbled into the electrolyte during deposition to deposit superconductor precursors onto a wide variety of substrates for subsequent annealing for production of superconducting oxide films. The present invention is further directed to a process of preparing superconducting oxide films from annealed multilayered precursors, wherein the precursor comprises two or more separately electrodeposited layers and wherein an intermediate Ag layer is deposited between each electrodeposited layer. The electrodeposited layers in the multilayered precursors are deposited from an electrolyte solution, which may or may not be saturated with oxygen.

2. Description of Related Art

There has been a great deal of effort expended in designing and developing suitable processes for making superconducting oxide films. The most desirable of such processes are those that are simple, efficient, and capable of producing a superconducting oxide film with a relatively high superconducting transition temperature ($T_c$) Processes which employ electrodeposition as part of the superconductor fabrication procedure have been proposed due to the simplicity, reproducibility, and coating quality that can be obtained using electrodeposition techniques. The deposition processes used to form superconducting oxide films typically involve electroplating a mixture of the desired metals onto a suitable surface to form a film of superconducting precursor metals, which is then annealed at high temperature to form the superconducting oxide. Various methods have been used for the preparation of superconductors. One such general methodology for preparing superconducting oxide films comprises the electrochemical deposition of a mixture of appropriate metals on a substrate, followed by oxidation of the deposited, mixture into the superconducting oxide film. A related method comprises the sequential electrodeposition of layers of appropriate metals on a substrate, followed by oxidation of the deposited, layers. Another approach involves suspending, dispersing or dissolving superconductor precursor components within a liquid medium, followed by electrodeposition on a substrate and subsequent oxidation of the entire mass. Exemplary electrodeposition procedures are set forth in the following U.S. Pat. Nos.: 4,870,051; 4,879,270; 4,939,308; 5,120,707; and 5,162,295. The superconducting oxide films may be prepared on various substrates, including wires or tapes, depending on the desired use of the superconducting oxide film.

The primary technical challenge that must be satisfied to permit usage of high temperature superconducting (HTS) wires or tapes in superconducting magnets or power-related applications is the successful demonstration of a low-cost, high-field, high current-carrying wire or tape with acceptable mechanical properties. A great deal of effort has recently been directed to the use of $YBa_2Cu_3O_{7-x}$ (YBCO). YBCO has useful magnetic properties at 77 K, but it is highly susceptible to magnetic field degradation in the transport current due to weak links resulting from high-angle grain boundaries.

Thallium (Tl)-based superconducting oxide films present an alternative to YBCO due to a number of features, including high transition temperatures reaching to 127 K and unique features in their growth morphology. Nabatame et al. *Physica C* (1992) 193: 390) reported a magnetic field versus temperature irreversibility line for a thallium-based superconducting oxide that compared favorably at 77 K with the YBCO performance.

Although many of the previously-developed deposition procedures are suited for their intended purposes, there is still a continuing need to develop further and even better deposition procedures that are simple, efficient, and capable of producing superconducting oxide films that have relatively high superconducting transition temperatures. There is also a continuing need to develop efficient deposition procedures for producing thick superconducting oxide films having good film morphology and the are suitable for use in superconducting magnets and other power related applications.

SUMMARY OF THE INVENTION

Accordingly, it is a general object of this invention to provide a fast, cost-effective method for producing superconducting oxide films.

It is another object of this invention to provide methods for producing superconducting oxide films having improved film morphology and improved film quality.

It is another object of this invention to provide methods for producing superconducting films having current densities of at least $10^6$ A/cm$^2$ at 77 K in a zero field and a transport current of at least 10 A/mm.

To achieve the foregoing and other objects and in accordance with the purposes of the present invention, as embodied and broadly described herein, one embodiment of this invention comprises a method for producing high quality superconducting oxide films, wherein the method comprises electrodepositing superconducting precursors on a substrate with a silver (Ag) layer sandwiched between adjacent layers of the superconducting material layers. The superconducting precursor layers are formed by providing an electrodeposition bath comprising an electrolyte medium and a substrate (i.e., working) electrode, and providing to the bath a plurality of precursor metal salts that are capable of exhibiting superconducting properties upon subsequent treatment. The superconducting precursor is then formed by electrodepositing a first electrodeposited (ED) layer onto the substrate electrode, wherein the first electrodeposited (ED) layer contains a mixture of the precursor metals in proportions which are required for formation of the superconducting oxide film. After the first electrodeposited (ED) layer, the layer of silver (Ag) is deposited onto the first electrodeposited (ED) layer, and then the second electrodeposited (ED) layer is deposited onto the Ag layer, wherein the second electrodeposited (ED) layer contains a mixture of the precursor metals in proportions which are required for formation of the superconducting oxide film. The precursor, comprising the second (ED) layer/Ag/first (ED) layer, which is formed on the substrate electrode, is then oxidized at a sufficient annealing temperature in air or an oxygen-containing atmosphere to form a crystalline superconducting oxide film.

To further achieve the foregoing and other objects and in accordance with the purposes of the present invention, another embodiment of this invention comprises a process for producing high quality superconducting oxide films, wherein oxygen ($O_2$) is bubbled into the electrodeposition bath. The method comprises forming a precursor on a substrate, wherein the superconductor precursor is deposited by first electrodepositing a first electrodeposited (ED) precursor layer onto a substrate, wherein oxygen is bubbled into the electrodeposition bath during the electrodeposition, followed by depositing a layer of silver (Ag) onto the first electrodeposited (ED) precursor layer, and then electrodepositing a second electrodeposited (ED) precursor layer onto the Ag layer, wherein oxygen is bubbled into the electrodeposition bath during electrodeposition of the second electrodeposited (ED) precursor layer. The precursor comprising the second (ED) layer/Ag/first (ED) layer is then further oxidized at a sufficient annealing temperature in air or an oxygen-containing atmosphere to form a crystalline superconducting oxide film.

To further achieve the foregoing and other objects and in accordance with the purposes of the present invention, another embodiment of this invention comprises a process for producing superconducting oxide films, wherein the method comprises depositing a superconductor precursor onto a substrate, wherein oxygen is bubbled into the electrodeposition bath during electrodeposition of the electrodeposited layer. The superconductor precursor is then further oxidized at a sufficient annealing temperature to form a superconducting oxide film.

To further achieve the foregoing and other objects and in accordance with the purposes of the present invention, another embodiment of this invention comprises a process for producing high quality Tl—Bi—Sr—Ba—Ca—Cu—Ag—O superconducting oxide films from superconductor precursors comprising Tl—Bi—Sr—Ba—Ca—Cu, wherein the precursor comprises excess copper (Cu).

In accordance with the present invention, a deposition process which is based upon electrodeposition is provided for producing superconducting oxide films. The process is simple, efficient, and capable of producing superconducting oxide films having relatively high superconducting transition temperatures.

The improved electrodeposition method of the present invention provides a process which has considerable practical potential, particularly in the fabrication of large, non-planar devices. The improved deposition method is a low-cost process that has the ability to deposit films of oxide film superconductors on substrates of any shape, including wires and tapes. The annealing time required to oxidize the deposited precursors in accordance with the present invention is decreased, because mixing of the deposited metal ions occurs at an atomic level, which results in the production of submicron sized particles that are produced in the precursor and are especially well suited for oxidation to form superconducting oxide films.

BRIEF DESCRIPTION OF THE FIGURES

The accompanying drawings, which are incorporated in and form part of the specification, illustrate the preferred embodiments of the present invention and together with the descriptions serve to explain the principles of the invention.

In the Drawings.

DETAILED DESCRIPTION OF THE PREFERRED EMBODIMENTS

Figure 1:
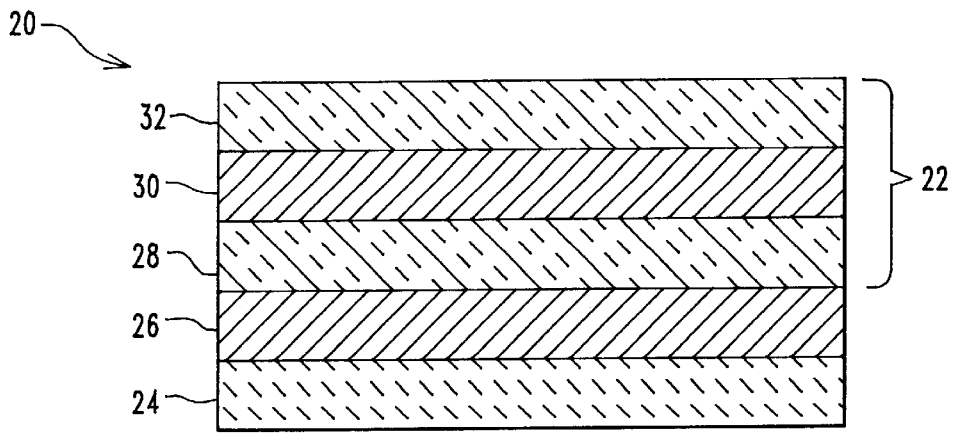
FIG. 1 is a cross-sectional illustration of a precursor for producing a superconducting oxide film deposited onto an Ag-coated substrate, wherein the precursor comprises two layers of electrodeposited (ED) layers having an intermediate Ag layer.

With reference to FIG. 1, one embodiment of this invention for preparing a superconducting oxide film comprises forming structure 20 comprising a multi-layered superconductor precursor 22 deposited onto a substrate 24. Preferably substrate 24 is coated with a layer of silver (Ag) 26. The precursor 22 may comprise a first electrodeposited (ED) precursor layer 28 electrodeposited onto Ag (26)-coated substrate 24 by co-electrodeposition of the constituent metal atoms. A second Ag layer 30 is then deposited onto first electrodeposited (ED) layer 28, and then a second electrodeposited (ED) precursor layer 32 is electrodeposited onto Ag layer 30 by co-electrodeposition of the constituent metal atoms. The precursor 22, comprising layers 28, 30, 32, is then oxidized by annealing at a high temperature in air or an oxygen-containing atmosphere to produce a superconduting oxide film. This process is effective for producing a wide variety of superconducting oxide films. The present invention is particularly well-suited for producing superconducting oxide films such as TlBiSrBaCaCuO (TBSBCCO) and TlCrSrCaCuO (TCSCCO). This method may also be used in producing any other known superconducting oxides. Thus, while the preferred methods of this invention discussed below are described in terms of preparing a TBSBCCO superconducting oxide film, it is to be understood that the methods of the invention may be used in the preparation of many other types of superconducting oxide films.

The separate electrodepositions of first precursor layer 28 and second precursor layer 32 are each carried out using either a conventional two-electrode cell or preferably a conventional three-electrode cell. A conventional three-electrode cell comprises a substrate electrode that has a surface upon which superconducting precursor metals are deposited. The substrate (i.e., working) electrode, along with a counter electrode and a reference electrode, is immersed in a solution that comprises a mixture of the metal ions to be deposited. The metal ions are co-electrodeposited onto the surface of the substrate electrode to form a film thereon, which includes a mixture of the superconducting precursor metals in the proportions that are required for formation of a superconducting oxide film.

Preferably, the substrate electrode will be a Ag (26)-coated substrate 24, wherein substrate 24 is any suitable substrate for the final superconducting film. Preferred substrates 24 include silver (Ag)-coated single crystal $LaAlO_3$ (Ag/LAO), silver (Ag)-coated substrates of yttria-stabilized zirconia (YSZ) such as $Ag/CeO_2$/YSZ, silver (Ag)-coated single crystal $SrTiO_3$ (STO) substrates, and silver (Ag)-coated substrates of buffered textures metal substrates (e.g., nickel (Ni), nickel/chromium (Ni/Cr), palladium (Pd), such as $Ag/CeO_2$/YSZ/$CeO_2$/Ni, $Ag$/LAO/STO/$CEO_2$/Ni, and Ag/STO/Ni. The shape of the substrate electrode comprising Ag (26)-coated substrate 24 can be in virtually any form, including wires, tapes and any other desired shape onto which the superconducting film is to be fabricated. The counter electrode is preferably made from platinum or other inert material. The reference electrode is preferably Ag (pseudo-reference).

The electrolyte bath can be any of the known electrolyte baths comprising superconducting precursor metal ions in an electrolyte (i.e., a solvent which conducts ions) that have been used to electrodeposit metal films onto substrate (working) electrodes. Metal ions may include Tl, Bi, Sr, Ba, Ca, Cu, Cr, La, Y, Sm, Eu, Gd, Tb, Dy, Ho, Er, Pb, Hg, Ag, Tm Yb, Lu, and Th. The particular concentrations of the superconducting precursor metal ions are selected depending upon the desired superconducting oxide film. The particular metal ions and their concentrations within the electrolyte are either well-known or may be determined with a small amount of routine experimentation. The relative concentrations of the superconducting precursor metal ions are chosen in proportions that are sufficient to insure that subsequent oxidation of the deposited film results in the formation of a superconducting oxide film. The metal ions are preferably added to the electrolyte as metal salts, which are soluble in the electrolyte. The metal salts dissociate to produce metal ions upon dissolution of the metal salts. Nitrate salts are preferred. However, other conventional metal salts, such as chloride salts and acetate salts, are suitable, provided that the metal salts are soluble in the selected electrolyte.

A preferred electrolyte (i.e., a solvent which conducts ions) for preparing the electrolyte solution is dimethyl sulfoxide (DMSO). Other conventional electrolytes may be utilized, including mixtures of water and DMSO, dimethylformamide (DMF), and mixtures of water and DMF. The amount of water in the mixtures with DMSO or DMF can range from 0.1 volume percent to 50 volume percent. When a mixture of water and DMSO or DMF is used, it is C, preferred that the amount of water in the mixture be on the order of 1 to 3 volume percent. Trifluoroacetic acid ($CF_3COOH$), including mixtures of trifluoroacetic acid and water, may also be used as the electrolyte, especially if it is desired to incorporate fluoride (F) ions into the superconducting film.

Once the electrolyte solution comprising and electrolyte and the desired metal ions (i.e., the dissolved metal salts) has been prepared, the substrate electrode (e.g., a Ag (26) coated-substrate 24), the counter electrode, (and the reference electrode if a three-electrode cell is used) are immersed into the solution. A direct current having a voltage of between 2 to 5 volts is applied between the substrate electrode (e.g., a Ag (26) coated-substrate 24) and the counter electrode. The particular voltage which is applied between the counter and substrate electrodes, and the duration of the applied voltage will vary depending upon the particular metal ions being deposited and the final superconducting oxide film desired. It is a matter of routine experimentation to vary the voltage within the ranges set forth above to establish applied voltages and electrodeposition times to optimize electrodeposition and superconducting oxide film production.

Referring again to FIG. 1, a first electrodeposited (ED) precursor layer 28, for example a Tl—Bi—Sr—Ba—Ca—Cu—O (TBSBCCO) precursor 28, is electrodeposited as described above onto Ag (26)-coated substrate 24 by immersing Ag (26)-coated substrate 24 into an electrolyte bath containing metal salts of thallium (Tl), bismuth (Bi), strontium (Sr), barium (Ba), calcium (Ca), and copper (Cu) dissolved in an electrolyte such as DMSO. After applying a voltage between the substrate electrode and the counter electrode for 1 to 15 minutes, a first electrodeposited (ED) layer 28 is electrodeposited onto Ag (26)-coated substrate 24. Preferably, the thickness of the first electrodeposited (ED) layer 28 is between about 0.4 μm and 5 μm thick.

After the first (ED) layer 28 has been electrodeposited onto Ag-coated substrate 24, the first electrodeposited (ED) layer/Ag/substrate structure comprising layers 24, 26, 28 is removed from the electrolyte solution and is placed in a conventional vapor deposition chamber. In the vapor deposition chamber, a layer 30 of silver (Ag) is deposited by a conventional physical vapor deposition method onto first electrodeposited layer 28 to produce a structure comprising Ag/first ED-layer/Ag/substrate structure, i.e., layers 24, 26, 28, 30, as shown in FIG. 1. Methods for depositing the Ag layer 30 by physical vapor deposition methods are known in the art. Preferably, Ag layer 30 is between about 100 Å and 1000 Å thick, and more preferably Ag layer 30 is about 300 Å thick.

The Ag/first ED-layer/Ag/substrate structure comprising layers 24, 26, 28, 30 described above is then immersed into either the same electrodeposition bath described above for electrodepositing first electrodeposited (ED) layer 28, or, alternatively, may be immersed in a fresh electrodeposition bath. The second electrodeposited layer 32, e.g., a TBSBCCO layer, is then electrodeposited onto Ag layer 30 in the same manner for about 1 to 15 minutes as described above to complete structure 20 comprising amorphous superconductor precursor 22 (comprising layers 28, 30, 32) deposited onto Ag(26)-coated substrate 24. Thus, the structure 20 shown in FIG. 1 can be described by the formula: second ED layer/Ag/first ED-layer/Ag/substrate, or more particularly, in the case of preparing a TBSBCCO superconducting film, structure 20 may be described as ED-TBSBCCO/Ag/ED-TBSBCCO/Ag/substrate. Preferably the thickness of the second electrodeposited (ED) layer 32 is between about 0.4 μm and 6 μm thick.

Once the amorphous precursor 22 comprising layers 28, 30, 32 is formed on Ag (26)-coated substrate 24 as described above, the next step toward formation of a superconducting oxide film according to the method of this invention involves oxidizing and annealing of the amorphous precursor 22 to convert amorphous precursor 22 into a crystalline superconducting oxide Tl—Bi—Sr—Ba—Ca—Cu—O (TBSBCCO) film. Annealing improves the homogeneity and quality of the superconducting oxide film. A high quality film is one that does not exhibit voids or vacancies in the film, which would reduce the efficiency of the film. The oxidation/annealing step is conducted by heating structure 20 temperatures between about 700° C. and 1000° C., preferably between 850° C. to 870° C., and may take place either in air or in an oxygen-containing atmosphere such as a mixture of argon and oxygen. In preparing thallium-based superconducting oxide films, it is preferable to conduct the annealing step in the presence of a thallium (Tl) source, such as a Tl—Bi—Sr—Ba—Ca—Cu—O (TBSBCCO) pellet or thallium oxide ($Tl_2O_3$), to replace the small amount of thallium (Ti) which is typically lost during the high annealing temperatures.

It was discovered that the preparation of precursor 22 in the first embodiment of the invention as described above, i.e., by separately electrodepositing a first electrodeposited (ED) layer 28 and then a second electrodeposited (ED) layer 32, wherein an intermediate Ag layer 30 is deposited between first 28 and second 32 electrodeposited layers, allowed for the fabrication of a thick (i.e., greater that 1 μm), crystalline, high quality superconducting oxide film having excellent morphology with no voids and with good film uniformity. Other attempts to make thick superconducting films by electrodepositing only one electrodeposited layer, wherein the single electrodeposited layer was made thicker simply by increasing the deposition time, resulted in films having poor film morphology. Thus the method of this invention comprising the separate electrodeposition of first and second electrodeposited (ED) layers 28 and 32, wherein a Ag layer 30 is formed between the ED layers 28 and 32, alleviates problems associated with earlier attempts to produce thick superconducting oxide films having good morphology and hence good film qualities.

The morphology of an electrodeposited precursor 22 is a very important step in the fabrication of superconducting oxide films, since the morphology of the precursor 22 directly influences the structure of the annealed superconducting oxide film and hence its properties. Preferably, the precursor 22 is annealed to produce superconducting oxide film that is free of voids, which can lead to poor film qualities. In the electrodeposition process, metal atoms deposit onto the surface Ag (26) layer of the substrate 24. With time, the thickness of the electrodeposited layer increases, and the deposition of metal atoms continues either by the buildup of metal atoms on previously deposited material (referred to as "old nucleation centers") or by the formation and growth of new nucleation centers. The buildup of old nucleation centers and the growth of new nucleation centers are in competition with each other and can be influenced by different factors. The buildup of metal atoms on old nucleation centers means that voids will result in areas where there is no film growth, which is a less desirable situation. Therefore, conditions that would increase the formation of new nucleation centers, thus creating new growth to fill in the voids, would be desirable. While not wishing to be bound by theory, the inventor believes that in the first embodiment of the method of this invention described above, wherein the precursor comprises two separately electrodeposited layers 28 and 32 and having an intermediate Ag layer 30 therebetween, the intermediate Ag layer 30 helps to fill in voids by creating new nucleation centers for film growth as the precursor 22 is being annealed to produce the superconducting oxide film. Thus, the inventor discovered that intermediate Ag layer 30 helped to improve the film morphology of the superconducting oxide film preventing voids in the annealed, crystalline superconducting oxide film, thereby.

While precursor 22 shown in FIG. 1 is illustrated having a three-layered EDTBSBCCO/Ag/ED-TBSBCCO configuration, the example shown in FIG. 1 is for illustration as only, and it is to be understood that there is no limitation to the number of alternating electrodeposited and Ag layers in precursor 22, and the number of ED/Ag/ED/Ag/ED/Ag . . . layers deposited in forming precursor 22 is only limited by the desired thickness of the superconducting oxide film.

In a second embodiment of this invention, a precursor 22 (FIG. 1) comprising layers 28, 30, 32 may be deposited onto a Ag (26)-coated substrate 24 in the manner described above, wherein the electrolyte bath used for separately electrodepositing first electrodeposited (ED) layer 28 and second electrodeposited (ED) layer 32 is first saturated with oxygen ($O_2$) by bubbling oxygen into the electrolyte prior to electrodeposition of layers 28 and 32, and wherein the oxygen bubbling into the electrolyte bath is maintained during the electrodeposition of layers 28 and 32. The intermediate Ag layer 30 is deposited in a similar manner as described above. The result of the deposition of layers 28, 30, 32 in the second embodiment of this invention, wherein oxygen is added to the electrolyte, is an amorphous precursor. For example a Tl—Bi—Sr—Ba—Ca—Cu—O (TBSBCCO) precursor, wherein some of the metals in precursor 22 may be present as single metal oxides (e.g., $Tl_2O_3$), mixed alloy oxides (e.g., Tl—Bi—O), hydroxides (e.g., $Tl(OH)_3$), and the like. The amorphous precursor 22 prepared in this second embodiment is annealed at high temperatures as described above in air or an oxygen-containing atmosphere to convert the partially oxidized, amorphous precursor to a crystalline superconducting oxide film. It was discovered that the addition of oxygen to the electrolyte bath further improved the film quality, as discussed below in Examples 2–5. While not wishing to be bound by theory, the inventor believes that bubbling oxygen into the electrodeposition bath during the electrodeposition results in a greater amount of metal oxides being deposited onto the substrate electrode relative to the amount of metals deposited onto the substrate. It is known that deposited metals can form metal carbonates and other impurities, which, if present in the superconducting oxide film after annealing the precursor, can degrade the superconducting properties of the superconducting oxide films. Thus, the inventor believes that by increasing the amount of metal oxides present in the precursor prior to annealing the precursor according to the method of this invention, the superconducting properties of the superconducting oxide films can be improved.

Figure 2:
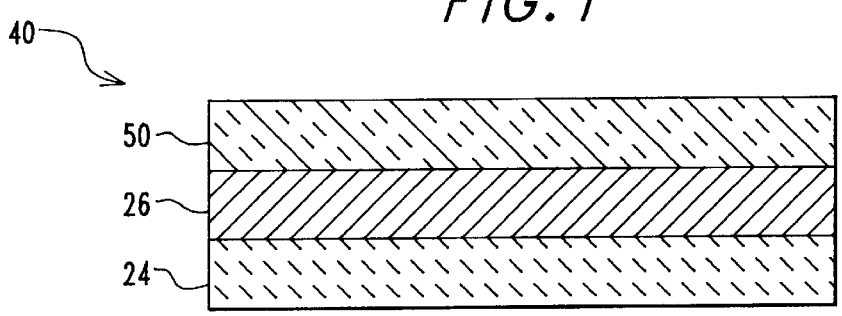
FIG. 2 is a cross-sectional illustration of a precursor for producing a superconducting oxide film deposited onto an Ag-coated substrate, wherein the precursor comprises a single electrodeposited (ED) layer.

In yet another embodiment of this invention, a method of making a superconducting oxide film may comprise preparing structure 40 illustrated in FIG. 2, wherein structure 40 comprises a single electrodeposited layer 50 onto a substrate 24 which is coated with a layer of silver (Ag) 26.

In the embodiment illustrated in FIG. 2, electrodeposited layer 50 is electrodeposited using either a conventional two-electrode cell or, preferably, a conventional three-electrode cell, as described above, by immersing Ag (26)-coated substrate 24 in an electrodeposition bath that has been saturated or entrained with oxygen, as described above. Preferably, the single electrodeposited (ED) layer 50 is electrodeposited over a period of about 1 to 15 minutes, while bubbling oxygen into the electrodeposition bath, to produce single electrodeposited (ED) layer 50 having a thickness of between about 0.4 and 6 $\mu$m. The electrodeposited layer 50 may be annealed, as described above, to form a superconducting oxide film, or electrodeposited layer 50 may be scraped from the substrate to form a powder for use in production of superconductors, including pellet and powder-in-tube products, as described in U.S. Pat. Nos. 5,413,987 and 5,789,348 which are assigned to the assignee of this invention and which are incorporated herein by reference.

In all of the embodiments described above, it was discovered that in preparing a TBSBCCO superconducting oxide film from a precursor comprising the metals Tl, Bi, Sr, Ba, Ca, and Cu in a ratio of $(TlBi)_{0.75-2}(SrBa)_2Ca_{1.75-2.5}Cu_x$, the quality of the film can be improved by increasing the amount of copper (Cu) from x=3 to x=4–5.

All of the above-described embodiments may also be used to produce superconducting oxide films other than TBSBCCO superconducting oxide films. For example, the above-described methods may be used to prepare superconducting oxide films such as Tl—Cr—Sr—Ca—CuO (TCSCCO) films prepared from precursors comprising the metals Tl, Cr, Sr, Ca, and Cu.

The novel methods described herein for preparing high quality superconducting oxide films, wherein the superconducting oxide films were prepared from precursors comprising separately electrodeposited first and second electrodeposited layers (electrodeposited either with or without the presence of oxygen in the electrodeposition bath) and having a layer of silver (Ag) therebetween, produced TBSBCCO and TCSCCO films having critical current densities of approximately $10^5$ A/cm$^2$ at 77 K and $10^6$ A/cm$^2$ at 77 K, respectively, as described below in the Examples, which are the highest critical current densities reported to date for a superconducting oxide film produced by an electrodeposition method. The superconducting oxide films produced by the methods of this invention have excellent film morphology with no voids.

The following examples demonstrate the practice and utility of the present invention but are not to be construed as limiting the scope thereof. Any suitable laboratory equipment known to those in the art can be utilized to electrodeposit and anneal the precursor films, and analyze the properties thereof, with the exceptions described below.

EXAMPLES

Example 1

Preparation of a TBSBCCO Superconducting Oxide Film via a Multiple Layer Process without Additional Oxygen a) Electrodeposition of a TBSBCCO Film An electrodeposition solution of dimethyl sulfoxide (DMSO) was prepared having the following salt concentrations of metal ions: 1.63 gm $TlNO_3$, 1 gm $Bi(NO_3)_2.5H_2O$, 17.7 gm $Sr(NO_3)_2$, 15.6 gm $Ba(NO_3)_2$, 8.46 gm $Ca(NO_3)_2.4H_2O$ and 6 gm $Cu(NO_3)_2.6H_2O$ dissolved in 390 ml of dimethyl sulfoxide (DMSO).

The electrodeposition was performed in a closed-cell configuration at 24° C. using a conventional three-electrode cell, where the reference electrode was Ag (pseudo-reference), the counter electrode was a Pt gauze, and the substrate (i.e., the working) electrode was a single crystal $LaAlO_3$ (LAO) coated with 300 Å Ag. The films were electroplated by using a constant potential of −3V. All samples were deposited in a vertical cell, where the electrodes (substrate, counter, and reference) were suspended vertically from the top of the cell. All chemicals were of Analar or Puratronic-grade purity and were used as received. A Princeton Applied Research potentiostat/galvanostat Model 273A with an IBM PC AT computer interface was used for controlling the pulsed-potential electrolysis and to monitor the current and voltage profiles.

The first electrodeposited (ED) layer was electrodeposited onto the Ag-coated LAO substrate by applying the voltage for 3 minutes. The resulting ED-TBSBCCO/Ag/LAO substrate was removed from the electrodeposition bath, and a thin layer (300 Å) of Ag was deposited onto the ED-TBSBCCO surface by physical vapor deposition using conventional methods known in the art. The Ag/ED-TBSBCCO/Ag/LAO substrate was placed back into the electrodeposition bath, and the second ED-TBSBCCO layer was electrodeposited onto the Ag/ED-TBSBCCO/Ag/LAO substrate for 3 minutes to provide a ED-TBSBCCO/Ag/ED-TBSBCCO/Ag/LAO precursor, where each of the separately electrodeposited TBSBCCO layers had the stoichiometry $Tl_{0.8}Bi_{0.3}Sr_{1.7}Ba_{0.5}Ca_2Cu_{4.1}$ as determined by inductively coupled plasma (ICP) spectroscopy. b) Annealing of the ED-TBSBCCO/Ag/ED-TBSBCCO/Ag/LAO precursor The ED-TBSBCCO/Ag/ED-TBSBCCO/Ag/LAO precursor from step (a) was annealed using a two-zone anneal (DeLuch, J. A. et al., *Physica C* (1993) 205:21; Bhattacharya, R. N., et al. *Physica C* (1994) 229:145) which employed a separate thallium (Tl) source and a sample zone in air at 850–870° C. for 30–60 minutes. The thallium source was a TBSBCCO pellet. The superconducting oxide film produced by this annealing process was cooled either by removing the sample from the heating chamber or by cooling the sample at a rate of 5° C. per minute to yield a 1.6 µm thick electrodeposited TBSBCCO superconducting oxide film.

The samples were characterized by X-ray diffraction including θ/2θ, pole figures, phi-scans, magnetization measurements, and scanning electron micrographs (SEM). The samples were evaluated for their superconducting properties by resistance versus temperature (R-T) measurements and four probe transport (critical current) measurements in He vapor. Four Ag contacts were made on the sample by evaporating Ag in vacuum. Ag wires were soldered to the Ag contacts using In solder. The samples were inserted slowly into the pre-cooled chamber of a squid-magnet that is capable of producing maximum fields of 5.5 T. The criterion for the critical current density measurements was 1 µV/cm electric field. The magnetic field was applied parallel to the c plane (H//c).

Figure 3:
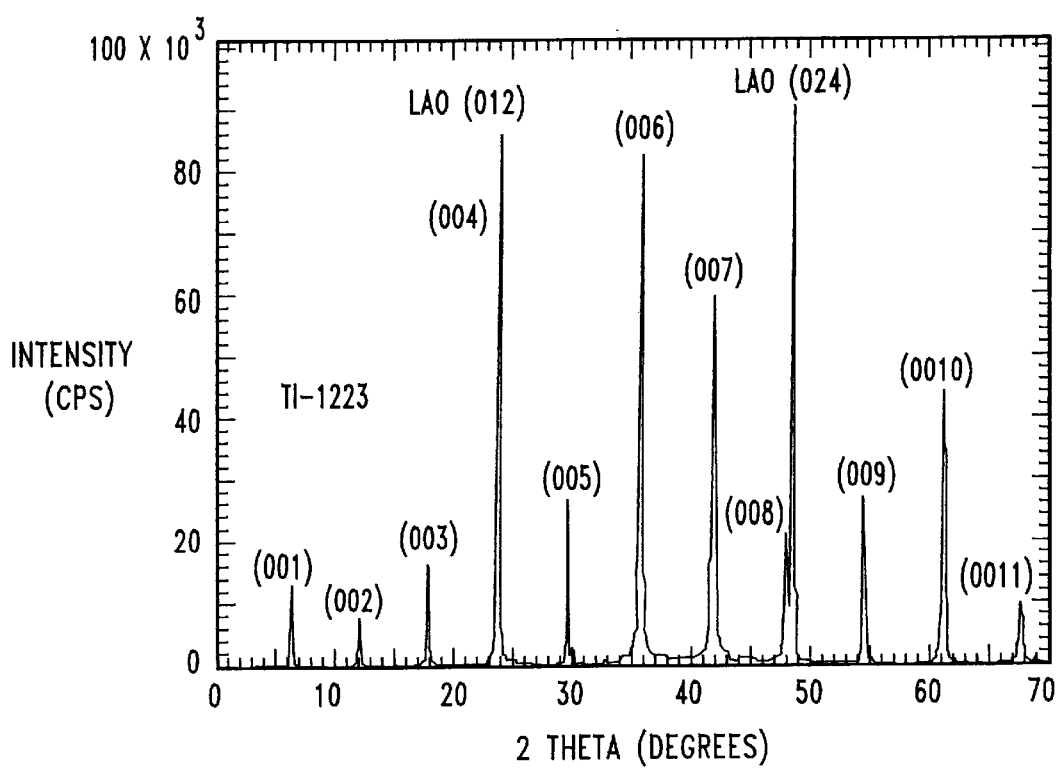
FIG. 3 is an X-ray diffraction (XRD) scan of a 1.6 $\mu$m thick thallium-based superconducting oxide film prepared by annealing an electrodeposited TlBiSrBaCaCuO/Ag/electrodeposited TlBiSrBaCaCuO precursor formed onto a Ag-coated LAO substrate, wherein the electrodeposited TlBiSrBaCaCuO layers were electrodeposited (ED) without the addition of oxygen to the electrolyte bath.
Figure 4:
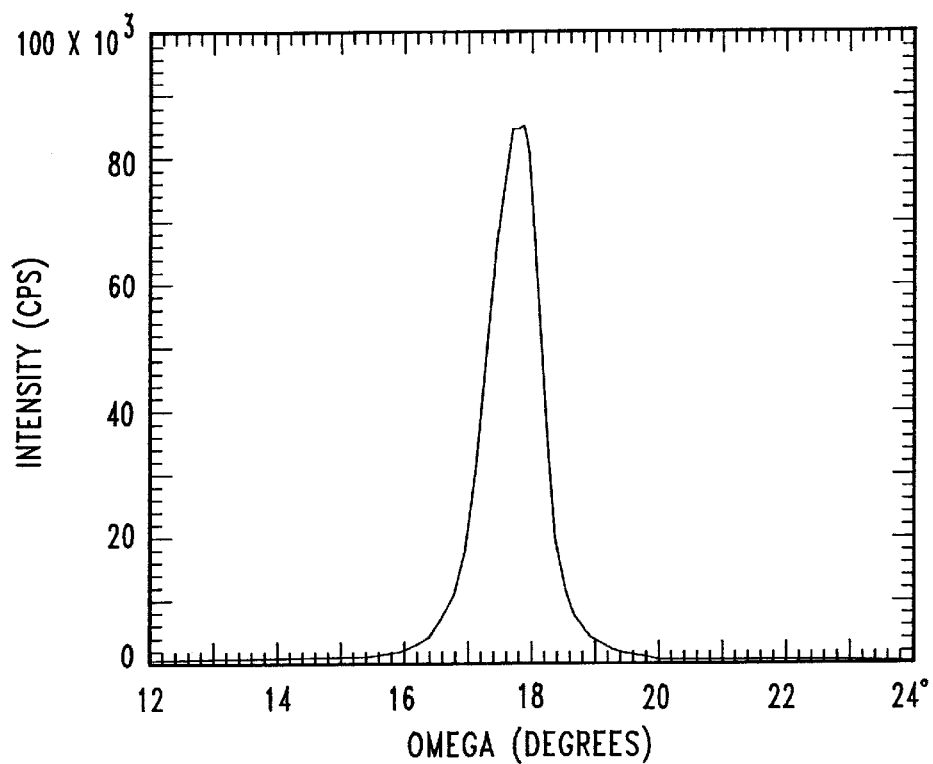
FIG. 4 is an omega scan of a 1.6 $\mu$m thick thallium-based superconducting oxide film prepared by annealing an electrodeposited TlBiSrBaCaCuO/Ag/electrodeposited TlBiSrBaCaCuO deposited onto a Ag-coated LAO substrate, wherein the electrodeposited TlBiSrBaCaCuO layers were electrodeposited without the addition of oxygen to the electrolyte bath.
Figure 5:
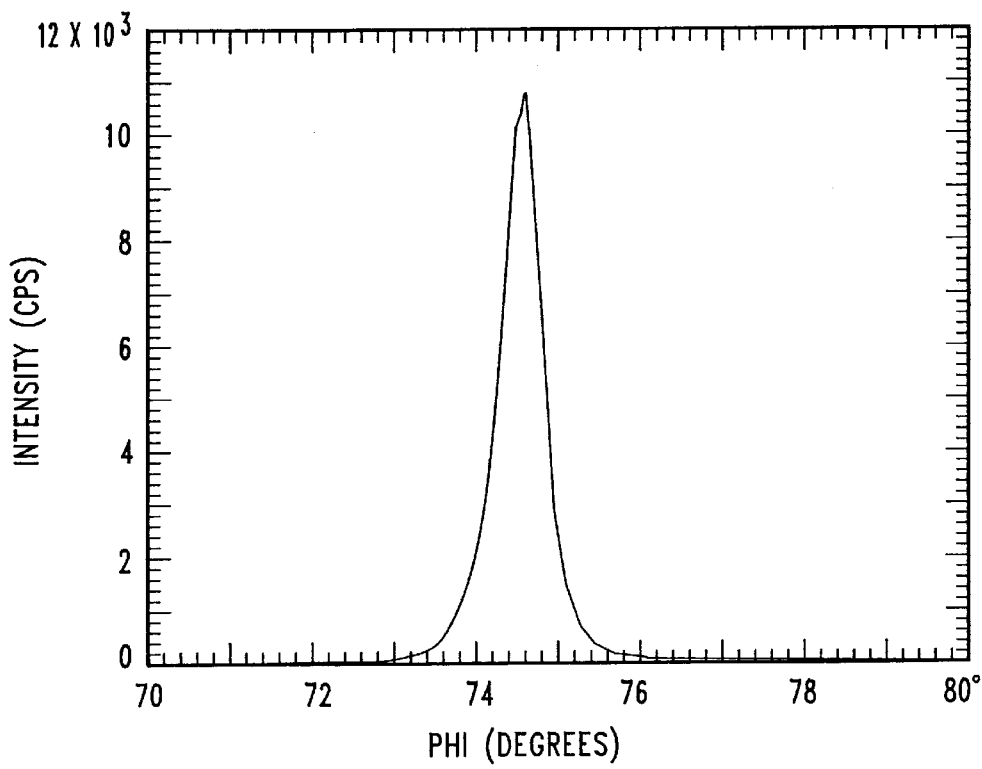
FIG. 5 is a phi scan of a 1.6 $\mu$m thick thallium-based superconducting oxide film prepared by annealing an electrodeposited TlBiSrBaCaCuO/Ag/electrodeposited TlBiSrBaCaCuO precursor deposited onto a Ag-coated LAO substrate, wherein the electrodeposited TlBiSrBaCaCuO layers were electrodeposited without the addition of oxygen to the electrolyte bath.
Figure 6:
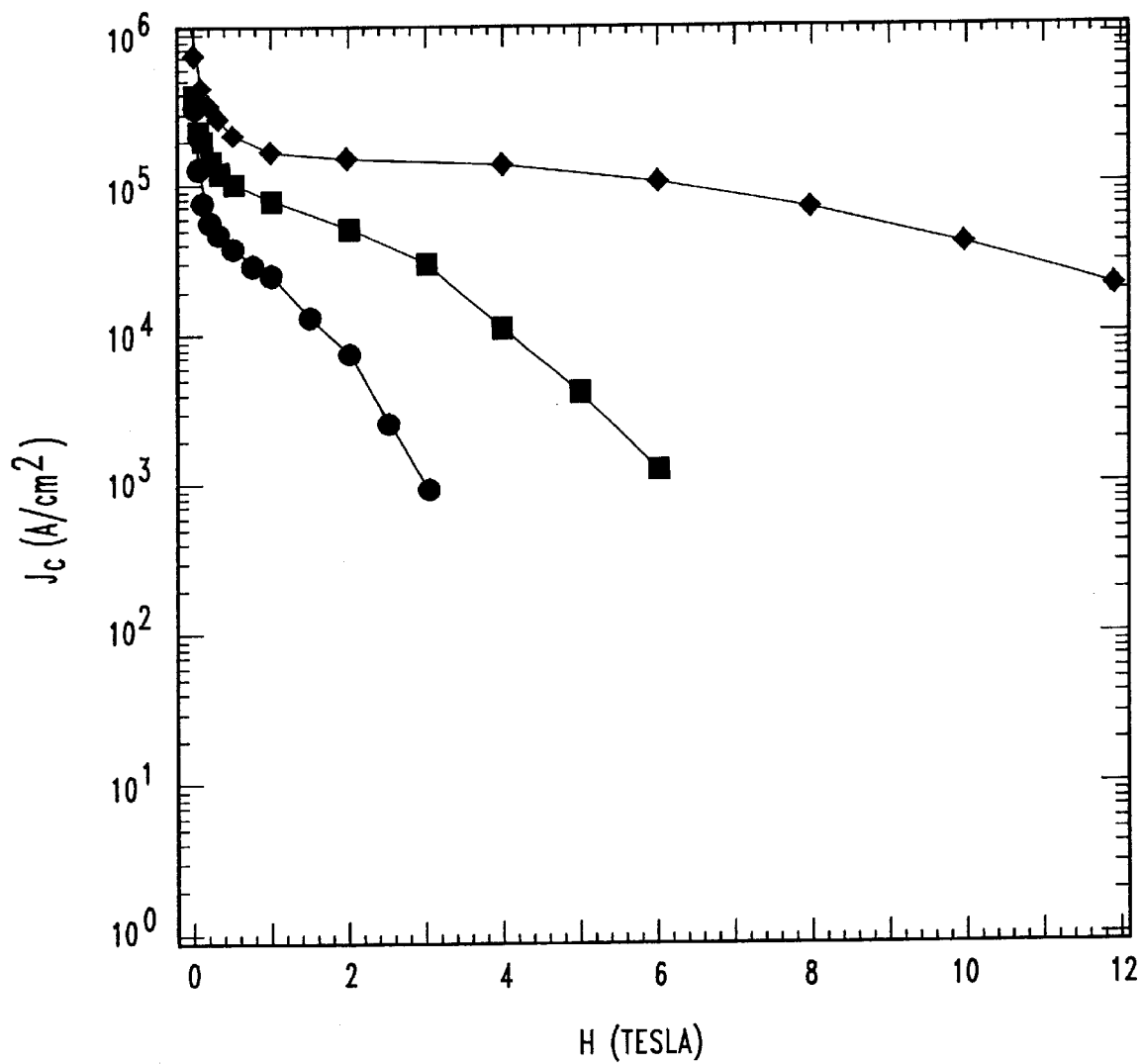
FIG. 6 is a graph showing the critical current density values versus magnetic field at 40 K (diamonds), 64 K (squares), and 77 K (circles) for a 1.6 $\mu$m thick thallium-based superconducting oxide film prepared by annealing an electrodeposited TlBiSrBaCaCuO/Ag/electrodeposited TlBiSrBaCaCuO precursor deposited onto a Ag-coated LAO substrate, wherein the electrodeposited TlBiSrBaCaCuO layers were electrodeposited without the addition of oxygen to the electrolyte bath.

An X-ray diffraction (XRD) of the TBSBCCO superconducting oxide film (FIG. 3) shows Tl-1223 phase development, and pole-figure measurements of the (105) HKL peak show biaxial texture. The omega scan (FIG. 4) and phi scan (FIG. 5) indicate a full width at half maximum (FWHM) of only 0.92° and 0.6°, respectively, indicating a very high quality film. The two-layer 1.6 µm (width=3.0 mm) thick TBSBCCO superconducting oxide film obtained from step (b) showed a transport critical current ($I_c$) of 18.93 A at 77 K (normalized $I_c$=63.1 A for 1 cm wide samples). The critical current density values ($J_c$) versus magnetic field (H) are shown in FIG. 6 where the $J_c$ values were measured at 40 K (diamonds), 64 K (squares), and 77 K (circles).

Example 2

Preparation of a TBSBCCO Superconducting Oxide Film via a Multiple Layer Process with Oxygen An electrodeposition solution of dimethyl sulfoxide (DMSO) was prepared having the following salt concentrations of metal ions: 1.4 gm $TlNO_3$, 1 gm $Bi(NO_3)_2.5H_2O$, 12.6 gm $Sr(NO_3)_2$, 11.5 gm $Ba(NO_3)_2$, 6.8 gm $Ca(NO_3)_2.4H_2O$ and 2.3 gm $Cu(NO_3)_2.6H_2O$ dissolved in 390 ml of dimethyl sulfoxide (DMSO). The electrolyte solution was saturated with oxygen prior to electrodeposition. A multi-layered film comprising two separately electrodeposited layers of TBSBCCO with a 300 Å intermediate layer of Ag was prepared as in Example 2, with the exception that oxygen was bubbled into the electrolyte solution during the electrodeposition of the TBSBCCO layers to form the ED-TBSBCCO/Ag/ED-TBSBCCO/Ag/LAO precursor, where the stoichiometry of each of the separately electrodeposited TBSBCCO layers was $Tl_{0.8}Bi_{0.3}Sr_{1.4}Ba_{0.5}Ca_2Cu_{4.3}$ as determined by inductively coupled plasma (ICP) spectroscopy. The multi-layered ED-TBSBCCO/Ag/ED-TBSBCCO/Ag/LAO precursor was annealed as described in Example 1 to provide a 2.6 µg thick TBSBCCO superconducting oxide film.

Figure 7:
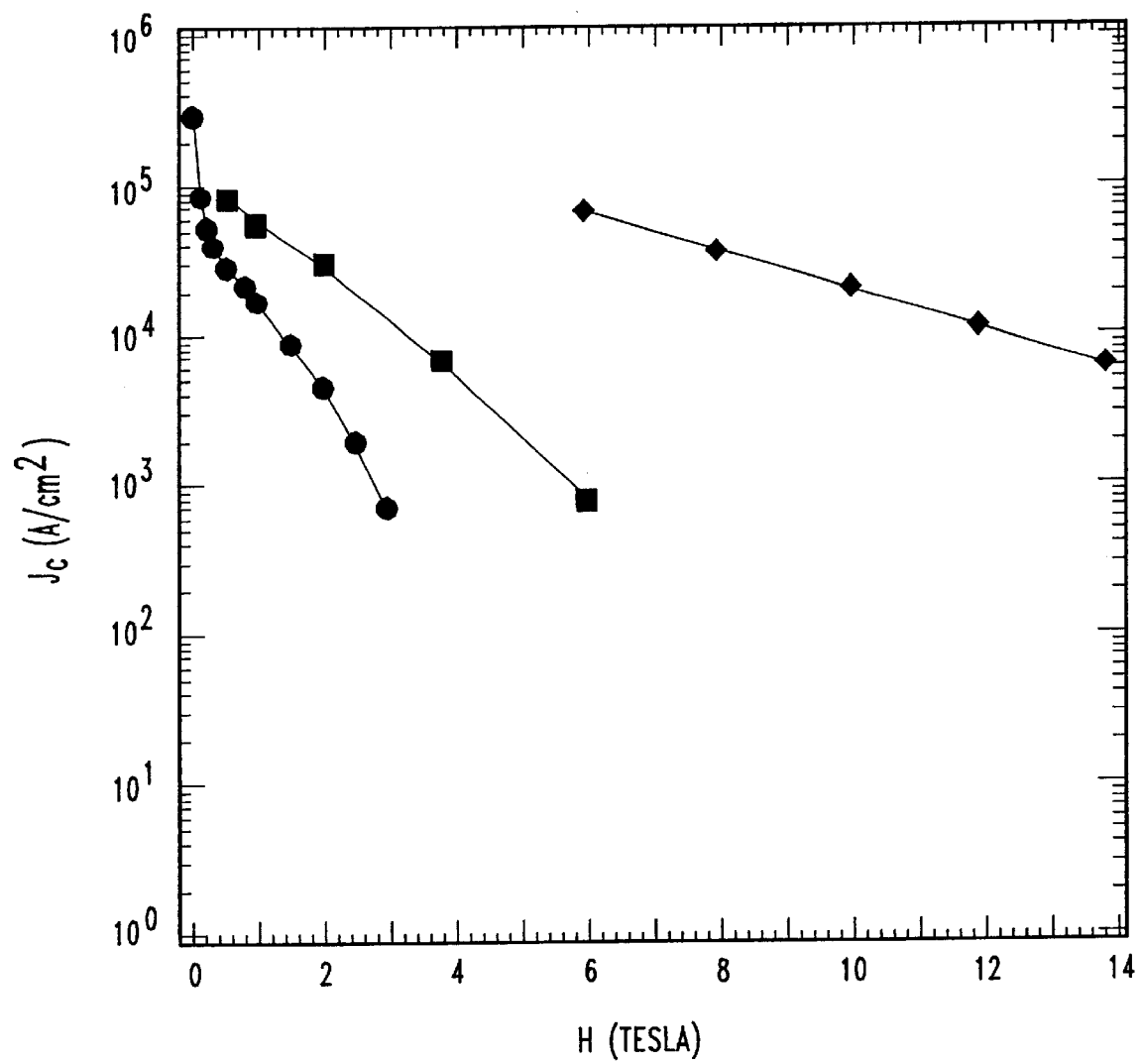
FIG. 7 is a graph showing the critical current density values versus magnetic field at 40 K (diamonds), 64 K (squares), and 77 K (circles) for a 2.6 $\mu$m thick thallium-based superconducting oxide film prepared by annealing an electrodeposited TlBiSrBaCaCuO/Ag/electrodeposited TlBiSrBaCaCuO precursor deposited onto a Ag-coated LAO substrate, wherein oxygen was added to the electrolyte bath during the electrodeposition of the electrodeposited TlBiSrBaCaCuO layers.

The two-layer 2.6 µm (width=3.2 mm) thick TBSBCCO superconducting oxide film prepared by the electrodeposition process of the invention wherein oxygen was bubbled into the electrodeposition bath showed a transport critical current ($I_c$) of 28.24 A at 77 K (normalized $I_c$=88.25 A for 1 cm wide samples). The critical current density values ($J_c$) versus magnetic field (H) for the TBSBCCO superconducting oxide film are shown in FIG. 7, where the $J_c$ values were measured at 40 K (diamonds), 64 K (squares), and 77 K (circles).

Example 3

Preparation of a TBSBCCO Superconducting Oxide Film via a Multiple Layer Process with Oxygen An electrodeposition solution of dimethyl sulfoxide (DMSO) was prepared having the i following salt concentrations of metal ions: 1.63 gm $TlNO_3$, 1 gm $Bi(NO_3)_2.5H_2O$, 25.8 gm $Sr(NO_3)_2$, 21.8 gm $Ba(NO_3)_2$, 9.6 gm $Ca(NO_3)_2.4H_2O$ and 6 gm $Cu(NO_3)_2.6H_2O$ dissolved in 390 ml of dimethyl sulfoxide (DMSO). A multi-layered film comprising two separately electrodeposited layers of TBSBCCO with a 300 Å intermediate layer of Ag was prepared as in Example 2 with the exception that oxygen was bubbled into the electrolyte solution during the electrodeposition of each of the TBSBCCO layers to form the precursor ED-TBSBCCO/Ag/ED-TBSBCCO, where each of the separately electrodeposited TBSBCCO layers had the stoichiometry $Tl_{0.8}Bi_{0.2}Sr_{1.2}Ba_{0.5}Ca_2Cu_{3.8}$ as determined by ICP spectroscopy. The precursor film obtained after the second electrodeposition was annealed as described in Example 1 to provide a 0.8 µm thick superconducting oxide film.

Figure 8:
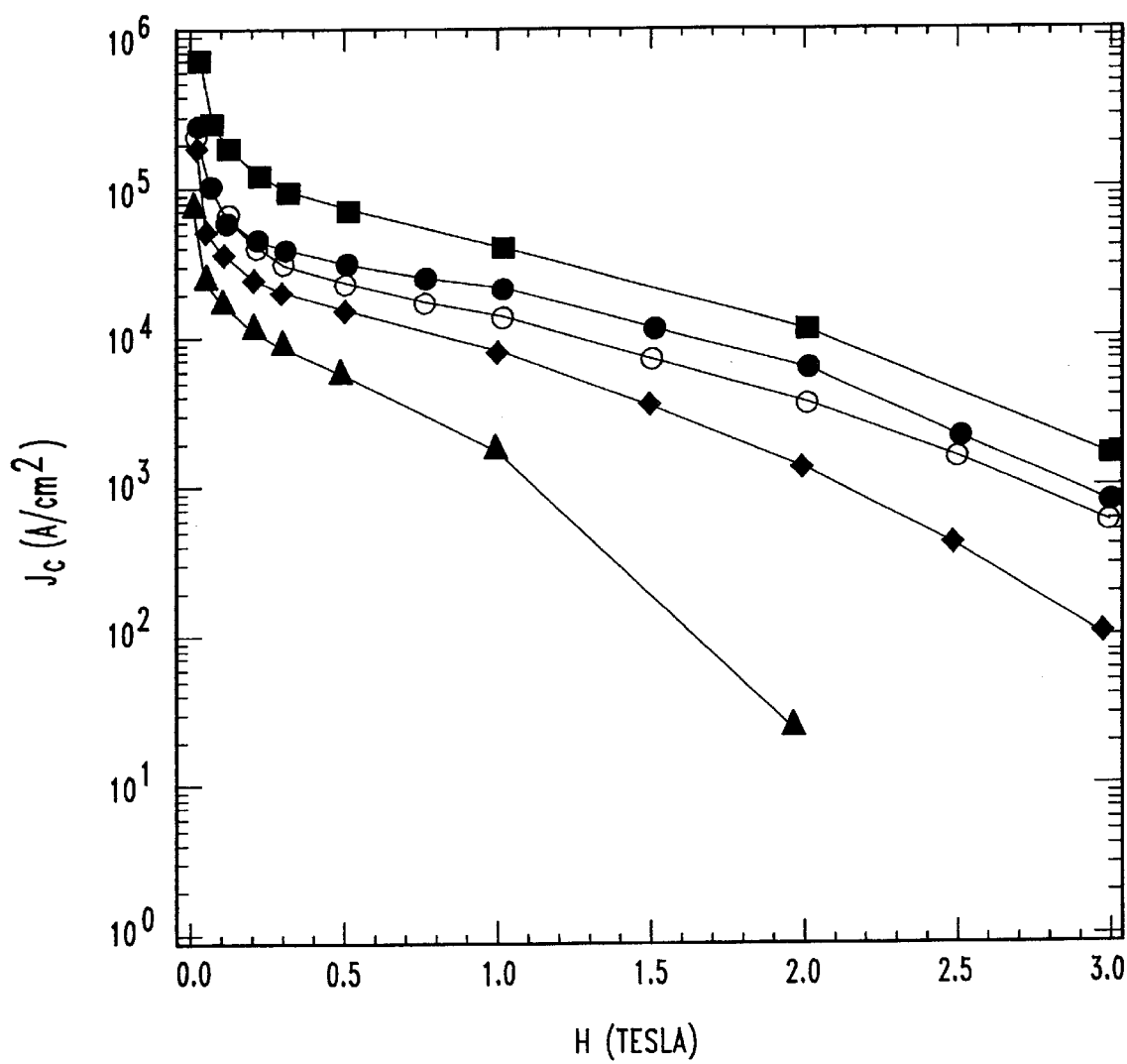
FIG. 8 shows a graph of the critical current density versus magnetic field measured at 77 K for: (a) a 0.8 $\mu$m thick thallium-based superconducting film prepared by annealing an electrodeposited TlBiSrBaCaCuO/Ag/electrodeposited TlBiSrBaCaCuO precursor deposited with the addition of oxygen to the electrolyte bath (solid squares), (b) a 1.6 $\mu$m thick thallium-based superconducting film prepared by annealing an electrodeposited TlBiSrBaCaCuO/Ag/electrodeposited TlBiSrBaCaCuO precursor deposited without the addition of oxygen to the electrolyte bath (solid circles), (c) a 2.6 $\mu$m thick thallium-based superconducting film prepared by annealing an electrodeposited TlBiSrBaCaCuO/Ag/electrodeposited TlBiSrBaCaCuO precursor deposited with the addition of oxygen to the electrolyte bath (open circles), (d) a 2.6 $\mu$m thick thallium-based superconducting film prepared by annealing an electrodeposited TlBiSrBaCaCuO precursor deposited with the addition of oxygen to the electrolyte bath (closed diamonds), and (e) a 2.5 $\mu$m thick thallium-based superconducting film prepared by annealing an electrodeposited TlCrBaCaCuO/Ag/electrodeposited TlCrBaCaCuO precursor deposited with the addition of oxygen to the electrolyte bath (closed triangles)

The 0.8 µm thick TBSBCCO superconducting oxide film showed a transport critical current ($I_c$) of 23.7 A at 77 K and no magnetic field (normalized $I_c$=87 A for 1 cm wide samples). The critical current density $J_c$ for the 0.8 µm thick electrodeposited TBSBCCO superconducting film at 77 K and no magnetic field was $1.1 \times 10^6$ A/cm$^2$ using the field criterion of 1 µV/cm (solid squares in FIG. 8). The critical current density of the film was calculated using the full cross-section of the sample (2.7 mm×0.8 µm).

Example 4

Preparation of a TBSBCCO Superconducting Oxide Film via a Single-layer Process with Oxygen An electrodeposition solution of dimethyl sulfoxide (DMSO) was prepared having the following salt concentrations of metal ions: 1.63 gm $TlNO_3$, 1 gm $Bi(NO_3)_2 \cdot 5H_2O$, 25.8 gm $Sr(NO_3)_2$, 21.8 gm $Ba(NO_3)_2$, 9.6 gm $Ca(NO_3)_2 \cdot 4H_2O$ and 6 gm $Cu(NO_3)_2 \cdot 6H_2O$ dissolved in 390 ml of dimethyl sulfoxide (DMSO). The electrolyte solution was saturated with oxygen prior to electrodeposition. A single layer of TBSBCCO was electrodeposited onto a Ag/LAO substrate while bubbling oxygen into the electrodeposition bath as described in Example 2 by applying the voltage for 10 minutes. The TBSBCCO precursor film obtained after the second electrodeposition was annealed as described in Example 1. A 2.6 μm thick TBSBCCO superconducting oxide film was obtained having the stoichiometry $Tl_{0.8}Bi_{0.2}Sr_{1.2}Ba_{0.5}Ca_2Cu_{3.8}$ as determined by ICP spectroscopy.

The 2.6 μm thick TBSBCCO superconducting oxide film showed a transport critical current ($I_c$) of 23.42 A at 77 K and no magnetic field (normalized $I_c$=68.8 A for 1 cm wide samples). The critical current density $J_c$ for the 2.6 μm thick electrodeposited TBSBCCO superconducting film at 77 K and no magnetic field was $2.6 \times 10^5$ A/cm² using the field criterion of 1 μV/cm (solid diamonds in FIG. 8). The critical current density of the film was calculated using the full cross-section of the sample (3.4 mm×2.6 μm).

Figure 9:
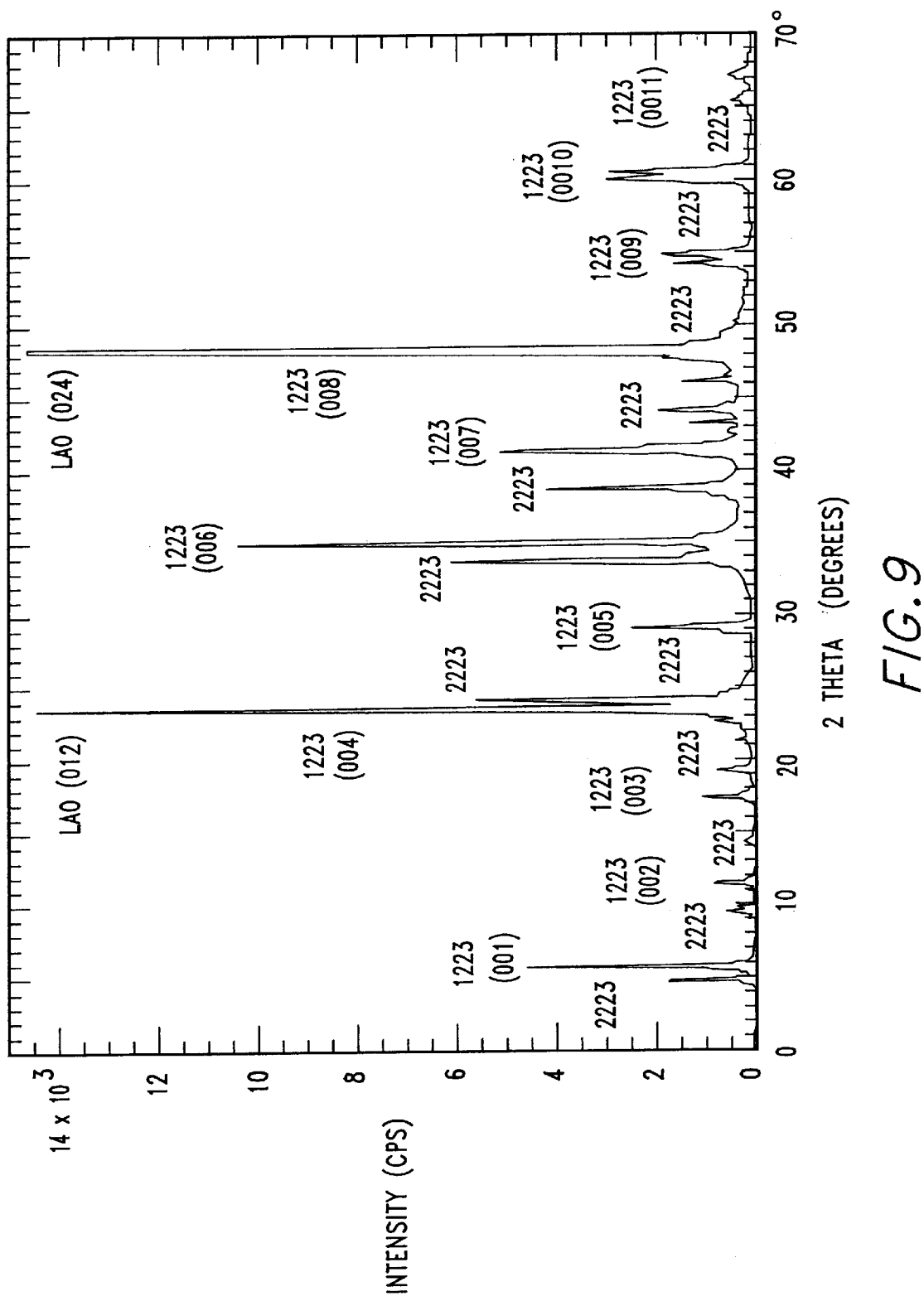
FIG. 9 is an X-ray diffraction (XRD) scan of a 2.6 μm thick thallium-based superconducting oxide film prepared by annealing an electrodeposited TlBiSrBaCaCuO precursor deposited onto a Ag-coated LAO substrate, wherein oxygen was bubbled into the electrolyte bath during the electrodeposition of the electrodeposited TlBiSrBaCaCuO layer.
Figure 10:
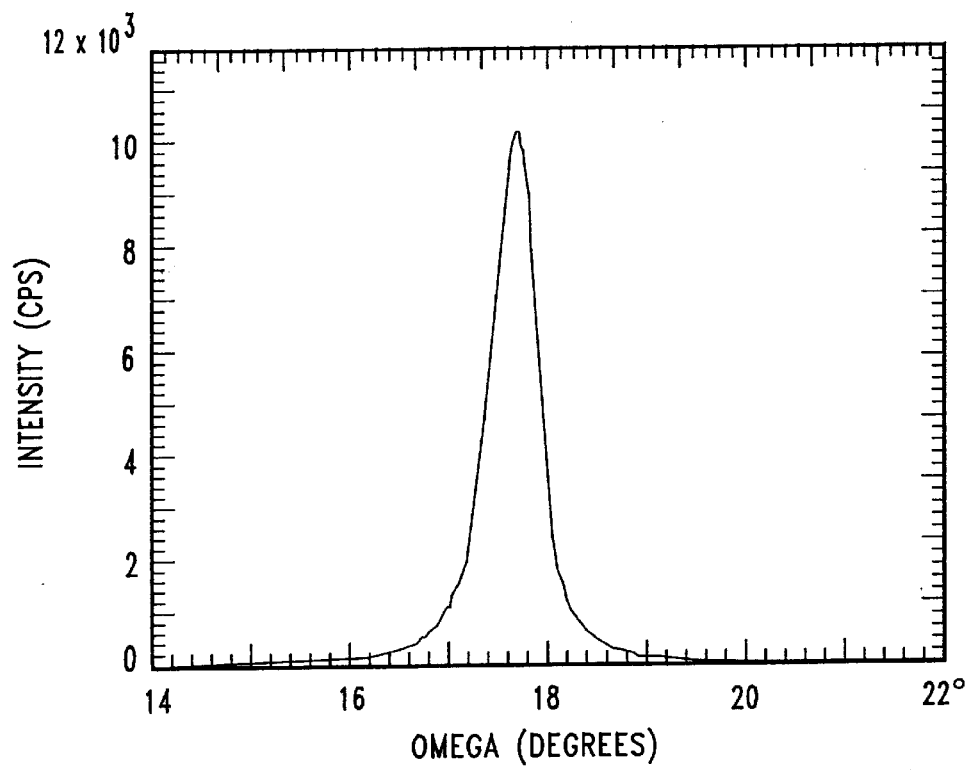
FIG. 10 is an omega scan of a 2.6 μm thick thallium-based superconducting oxide film prepared by annealing an electrodeposited TlBiSrBaCaCuO precursor, wherein oxygen was bubbled into the electrolyte bath during the electrodeposition of the electrodeposited TlBiSrBaCaCuO layer onto a Ag-coated LAO substrate.
Figure 11:
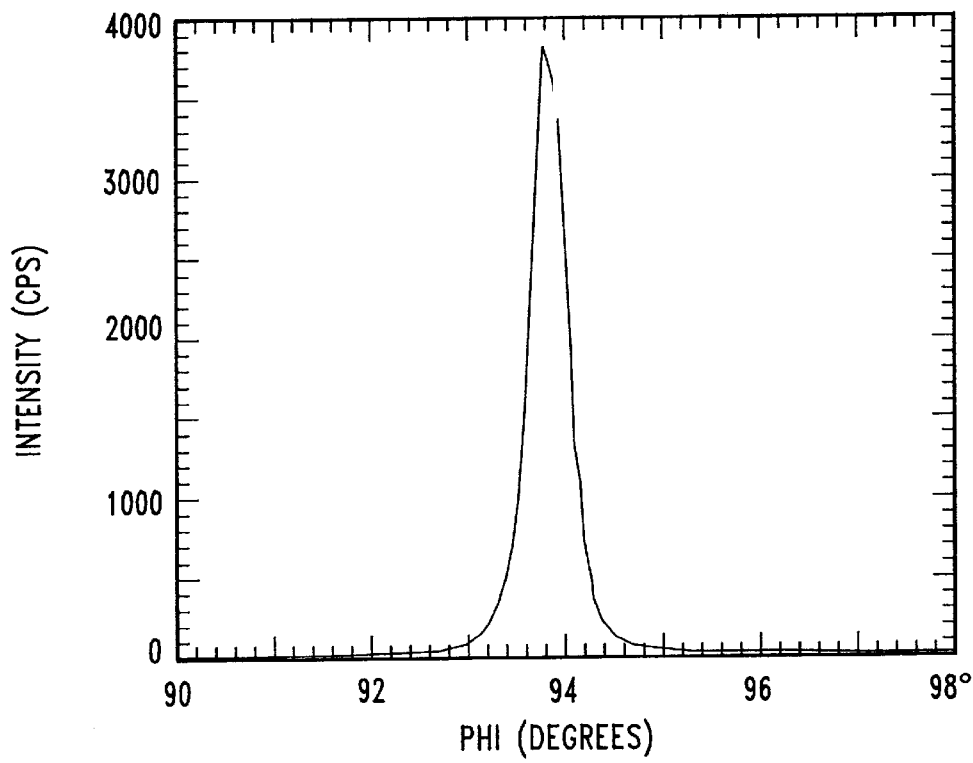
FIG. 11 is a phi scan of a 2.6 μm thick thallium-based superconducting oxide film prepared by annealing an electrodeposited TlBiSrBaCaCuO precursor, wherein oxygen was bubbled into the electrolyte bath during the electrodeposition of the electrodeposited TlBiSrBaCaCuO layer onto a Ag-coated LAO substrate.

An X-ray diffraction (XRD) of the TBSBCCO superconducting oxide film (FIG. 9) shows Tl-1223 phase development, and pole-figure measurements of the (103) HKL peak showed biaxial texture. The omega scan (FIG. 10) and phi scan (FIG. 11) indicate a full width at half maximum (FWHM) of only 0.52° and 0.5°, respectively, indicating a very high quality film.

Example 5

Preparation of a TCSCCO Superconducting Oxide Film via a Two-layer Process with Oxygen A electrodeposition solution of dimethyl sulfoxide (DMSO) was prepared having the following salt concentrations of metal ions: 1.7 gm $TlNO_3$, 0.6 gm $Cr(NO_3)_2 \cdot 9H_2O$, 15 gm $Sr(NO_3)_2$, 4.2 gm $Ca(NO_3)_2 \cdot 4H_2O$ and 3.3 gm $Cu(NO_3)_2 \cdot 6H_2O$ dissolved in 390 ml of dimethyl sulfoxide (DMSO). The electrodeposition solution was saturated with oxygen prior to electrodeposition. A multi-layered film comprising two separately electrodeposited layers of TCSCCO with a 300 Å intermediate layer of Ag was prepared as in Example 2, with the exception that oxygen was bubbled into the electrolyte solution during electrodeposition, to form a ED-TCSCCO/Ag/ED-TCSCCO precursor film, where each TCSCCO layer had the stoichiometry $Tl_{0.8}Cr_{0.1}Sr_{1.8}CaCu_{2.2}$ as determined by ICP spectroscopy. The ED-TCSCCO/Ag/ED-TCSCCO precursor film obtained after the second electrodeposition was annealed as described in Example 1. A 2.5 μm thick electrodeposited TCSCCO superconducting film was obtained.

The 2.5 μm thick TCSCCO superconducting oxide film showed a transport critical current ($I_c$) of 10.61 A at 77 K and no magnetic field (normalized $I_c$=34.2 for a 1 cm wide sample). The critical current density $J_c$ for the 2.5 μm thick electrodeposited TCSCCO superconducting film at 77 K and no magnetic field was $1.35 \times 10^5$ A/cm² using the field criterion of 1 μV/cm (solid triangles in FIG. 8). The critical current density of the film was calculated using the full cross-section of the sample (3.1 mm×2.5 μm).

Figure 12:
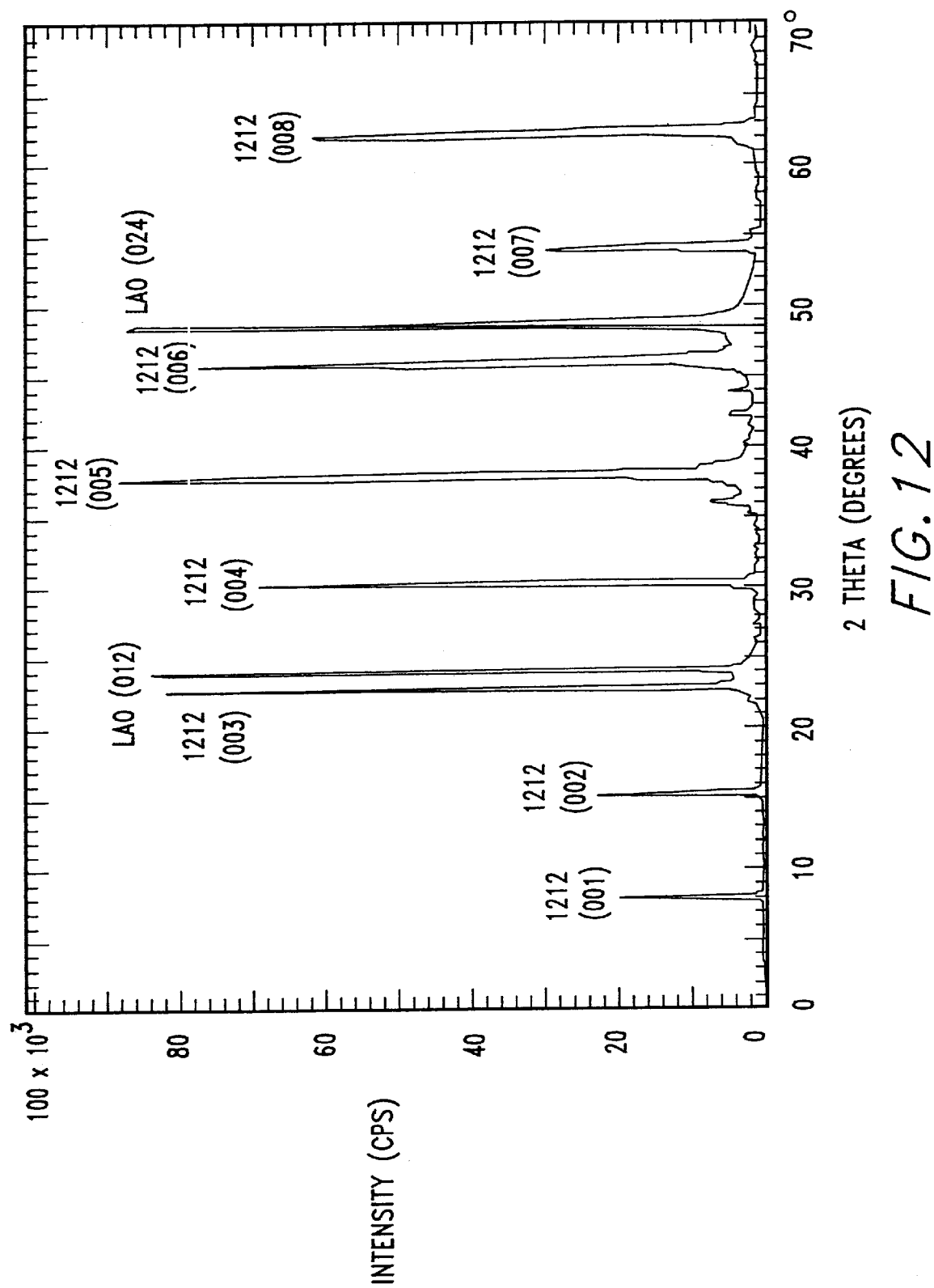
FIG. 12 is an x-ray diffraction (XRD) scan of a 2.5 μm thallium oxide film prepared by annealing an electrodeposited TlBiSrBaCaCuO/Ag/electrodeposited TlBiSrBaCaCuO precursor, wherein oxygen was bubbled into the electrolyte bath during the electrodeposition of the electrodeposited TlBiSrBaCaCuO layers onto a Ag-coated LAO substrate.
Figure 13:
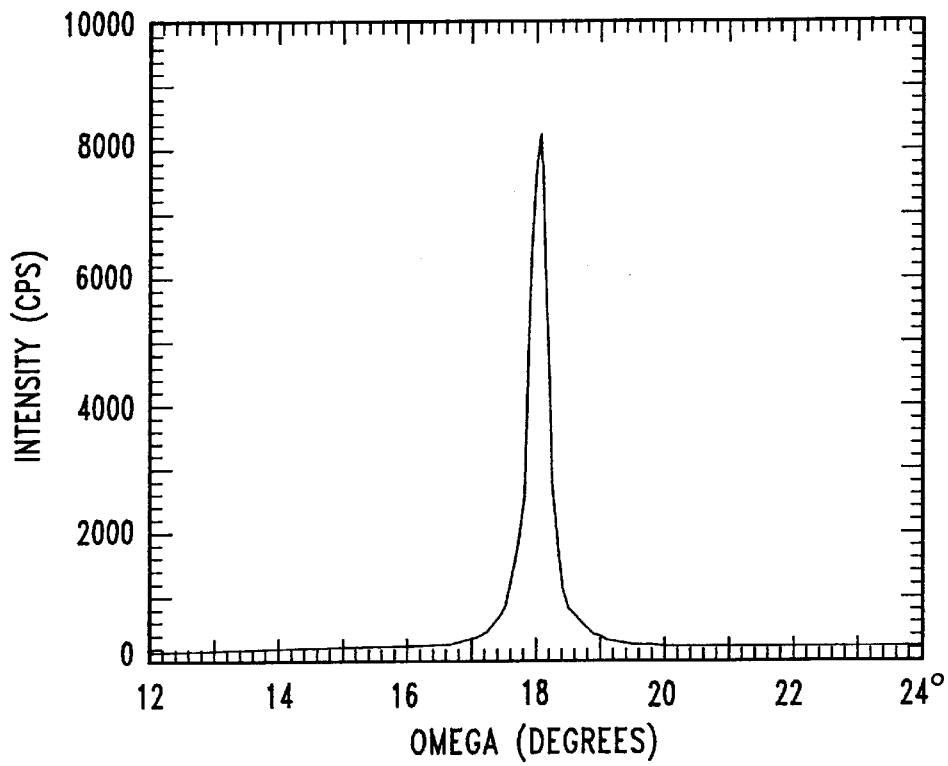
FIG. 13 is an omega scan of a 2.5 μm thick thallium-based superconducting oxide film prepared by annealing an electrodeposited TlBiSrBaCaCuO/Ag/electrodeposited TlBiSrBaCaCuO precursor, wherein oxygen was bubbled into the electrolyte bath during the electrodeposition of the electrodeposited TlBiSrBaCaCuO layers onto a Ag-coated LAO substrate.
Figure 14:
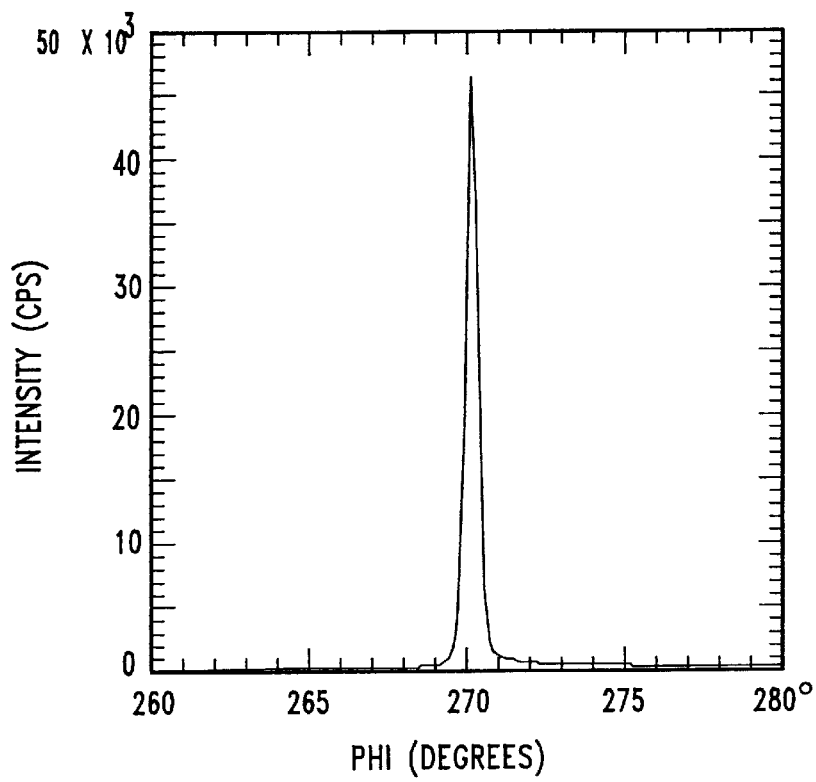
FIG. 14 is a phi scan of a 2.5 μm thick thallium-based superconducting oxide film prepared by annealing an electrodeposited TlBiSrBaCaCuO/Ag/electrodeposited TlBiSrBaCaCuO precursor, wherein oxygen was bubbled into the electrolyte bath during the electrodeposition of the electrodeposited TlBiSrBaCaCuO layers onto a Ag-coated LAO substrate.

An X-ray diffraction (XRD) of the TCSCCO superconducting oxide film (FIG. 12) shows Tl-1212 phase development, and pole-figure measurements of the (103) HKL peak showed biaxial texture. The omega scan (FIG. 13) and phi scan (FIG. 14) indicate a full width at half maximum (FWHM) of only 0.34° and 0.43°, respectively, indicating a very high quality film.

The foregoing description is considered as illustrative only of the principles of this invention. Further, since numerous modifications and changes will readily occur to those skilled in the art, it is not desired to limit the invention to the exact construction and process shown as described above. Accordingly, all suitable modifications and equivalents may be resorted to falling within the scope of the invention as defined by the claims that follow.

The words "comprise," "comprising", "include," "including," and "includes," when used in this specification and in the following claims, are intended to specify the presence of stated features, integers, components, or steps, but they do not preclude the presence or addition of one or more other features, integers, components, steps, or groups thereof.

The embodiments of the invention in which an exclusive property or privilege is claimed are defined as follows:

1. A method for making a superconducting oxide precursor film, said method comprising:
   a) providing an electrodeposition bath comprising an electrolyte medium and a substrate electrode;
   b) forming an electrolyte solution by providing to the bath soluble metal salts of a plurality of respective metals, oxides of which metals are capable of exhibiting superconductor properties;
   c) electrodepositing ions of each of the respective metals onto the substrate electrode to form a first electrodeposited layer thereon comprising a mixture of the respective metals in proportions sufficient to be oxidized into a superconducting oxide film;
   d) removing said substrate electrode having said first electrodeposited layer thereon from said electrolyte solution;
   e) depositing a layer of silver onto said first electrodeposited layer;
   f) immersing said substrate electrode having said first electrolyte layer deposited thereon and said silver layer deposited onto said first electrodeposited layer into said electrodeposition solution; and
   g) electrodepositing ions of each of the respective metals onto the silver layer to form a second electrodeposited layer thereon comprising a mixture of the respective metals in proportions sufficient to be oxidized into a superconducting oxide film to form said superconducting oxide precursor film.

2. The method of claim 1, further comprising oxidizing said superconducting oxide precursor film at a sufficient annealing temperature for forming a superconducting oxide film.

3. The method of claim 2, wherein said oxidizing is conducted in an ambient atmosphere.

4. The method of claim 2, wherein said oxidizing is conducted in the presence of a thallium-containing compound.

5. The method of claim 4 wherein said thallium-containing compound is a thallium-containing superconducting oxide pellet.

6. The method of claim 1, wherein said metal ions are selected from the group consisting of Ti, Bi, Sr, Ba, Ca, Cu, and Cr.

7. The method of claim 1, wherein said substrate electrode comprises a silver-coated single crystal $LaAlO_3$ substrate.

8. The method of claim 1, wherein said electrolyte solution comprises dimethyl sulfoxide.

9. The method of claim 1, wherein said metal salts are selected from the group consisting of nitrate salts, chloride salts, and acetate salts.

10. A method for making a superconducting oxide precursor film, said method comprising:
   a) providing an electrodeposition bath comprising an electrolyte medium and a substrate electrode;
   b) forming an electrolyte solution by providing to the bath soluble metal salts of a plurality of respective metals, oxides of which metals are capable of exhibiting superconductor properties;
   c) electrodepositing ions of each of the respective metals onto the substrate electrode while bubbling oxygen into said electrodeposition bath to form a first electrodeposited superconducting oxide precursor layer thereon comprising a mixture of the respective metals and oxides of the respective metals in proportions that are sufficient to form a superconducting oxide film should the respective metals in the first electrodeposited layer be subsequently further oxidized;
   d) removing said substrate electrode having said first electrodeposited layer thereon from said electrolyte solution;
   e) depositing a layer of silver onto said first electrodeposited layer;
   f) immersing said substrate electrode having said first electrodeposited layer deposited thereon and having said silver layer deposited on said first electrodeposited layer into said electrodeposition bath; and
   g) electrodepositing ions of each of the respective metals onto the silver layer while bubbling oxygen into said deposition bath to form a second electrodeposited superconducting oxide precursor layer thereon comprising a mixture of the respective metals and oxides of the respective metals in proportions that are sufficient to form a superconducting oxide film should the respective metals in the second electrodeposited layer be subsequently further oxidized.

11. The method of claim 10, wherein said metal ions are selected from the group consisting of Tl, Bi, Sr, Ba, Ca, Cu, and Cr.

12. The method of claim 10, wherein said substrate electrode comprises a silver-coated single crystal LaAlO$_3$ substrate.

13. The method of claim 10, wherein said electrolyte solution comprises dimethyl sulfoxide.

14. The method of claim 10, wherein said metal salts are selected from the group consisting of nitrate salts, chloride salts, and acetate salts.

15. The method of claim 10, including bubbling oxygen into the electrodeposition bath prior to electrodepositing the first electrodeposited layer.

16. The method of claim 10, including forming the first electrodeposited layer and the second electrodeposited layer with a greater amount of metal oxides being deposited relative to amount of metals being deposited than would otherwise occur if the step of bubbling oxygen into the electrodeposition bath was excluded.

17. A method for making a superconducting oxide precursor film, said method comprising:
   a) providing an electrodeposition bath comprising an electrolyte medium and a substrate electrode;
   b) forming an electrolyte solution by providing to the bath a plurality of soluble metal salts of a plurality of respective metals, oxides of which metals are capable of exhibiting superconductor properties; and
   c) electrodepositing ions of each of the respective metals onto the substrate electrode while bubbling oxygen into said electrodeposition bath to form an electrodeposited superconducting oxide precursor layer thereon comprising a mixture of the respective metals and oxides of the respective metals in proportions that are sufficient to form a superconducting oxide film should the respective metals in the electrodeposited layer be subsequently further oxidized.

18. The method of claim 17, wherein said metal ions are selected from the group consisting of Tl, Bi, Sr, Ba, Ca, Cu, and Cr.

19. The method of claim 17, wherein said substrate electrode comprises a silver-coated single crystal LaAlO$_3$ substrate.

20. The method of claim 17, wherein said electrolyte solution comprises dimethyl sulfoxide.

21. The method of claim 17, wherein said metal salts are selected from the group a consisting of nitrate salts, chloride salts, and acetate salts.

22. The method of claim 17, wherein said thallium-containing compound is a thallium-containing superconducting oxide pellet.

23. The method of claim 17, including bubbling oxygen into the electrodeposition bath prior to electrodepositing the electrodeposited layer.

24. The method of claim 17, including forming the electrodeposited layer with a greater amount of metal oxides being deposited relative to amount of metals being deposited than would otherwise occur if the step of bubbling oxygen into the electrodeposition bath was excluded.

25. A method for making a superconducting oxide film, said method comprising:
   a) providing an electrodeposition bath comprising an electrolyte medium and a substrate electrode;
   b) forming an electrolyte solution by providing to the bath soluble metal salts of a plurality of respective metals, oxides of which metals are capable of exhibiting superconductor properties;
   c) electrodepositing ions of each of the respective metals onto the substrate electrode while bubbling oxygen into said electrodeposition bath to form a first electrodeposited layer thereon comprising a mixture of the respective metals and oxides of the respective metals in proportions that are sufficient to form a superconducting oxide film when the respective metals in the first electrodeposited layer are subsequently further oxidized;
   d) removing said substrate electrode having said first electrodeposited layer thereon from said electrolyte solution;
   e) depositing a layer of silver onto said first electrodeposited layer;
   f) immersing said substrate electrode having said first electrodeposited layer deposited thereon and having said silver layer deposited on said first electrodeposited layer into said electrodeposition bath;
   g) electrodepositing ions of each of the respective metals onto the silver layer while bubbling oxygen into said deposition bath to form a second electrodeposited layer thereon comprising a mixture of the respective metals and oxides of the respective metals in proportions that are sufficient to form a superconducting oxide film when the respective metals in the second electrodeposited layer are subsequently further oxidized; and
   h) further oxidizing said first and second electrodeposited layers at a sufficient annealing temperature to form the superconducting oxide film.

26. The method of claim 25, wherein said further oxidizing is conducted in an ambient atmosphere.

27. The method of claim 25, wherein said further oxidizing is conducted in the presence of a thallium-containing superconducting oxide material.

28. A method for making a superconducting oxide film, said method comprising:
- a) providing an electrodeposition bath comprising an electrolyte medium and a substrate electrode;
- b) forming an electrolyte solution by providing to the bath a plurality of soluble metal salts of a plurality of respective metals, oxides of which metals are capable of exhibiting superconductor properties;
- c) electrodepositing ions of each of the respective metals onto the substrate electrode while bubbling oxygen into said electrodeposition bath to form an electrodeposited layer thereon comprising a mixture of the respective metals and oxides of the respective metals in proportions that are sufficient to form a superconducting oxide film when the respective metals in the electrodeposited layer are subsequently further oxidized; and
- d) further oxidizing said electrodeposited layer at a sufficient annealing temperature for forming the superconducting oxide film.

29. The method of claim 28, wherein said further oxidizing is conducted in an ambient atmosphere.

30. The method of claim 28, wherein said further oxidizing is conducted in the presence of a thallium-containing compound.

* * * * *